United States Patent
Luhn et al.

(10) Patent No.: US 6,645,683 B2
(45) Date of Patent: Nov. 11, 2003

(54) CONTROL SYSTEM AND METHODS FOR PHOTOLITHOGRAPHIC PROCESSES

(75) Inventors: Gerhard Luhn, Radebeul (DE); Daniel Sarlette, Radebeul (DE)

(73) Assignee: Infineon Technologies AG, Munich (DE)

(*) Notice: Subject to any disclaimer, the term of this patent is extended or adjusted under 35 U.S.C. 154(b) by 130 days.

(21) Appl. No.: 09/919,230

(22) Filed: Jul. 31, 2001

(65) Prior Publication Data

US 2002/0012861 A1 Jan. 31, 2002

(30) Foreign Application Priority Data

Jul. 31, 2000 (DE) .......................... 100 37 243

(51) Int. Cl.[7] .............................. G03F 9/00; G01B 11/00
(52) U.S. Cl. ............................. 430/30; 430/22; 356/399
(58) Field of Search ........................ 430/30, 22; 356/399

(56) References Cited

FOREIGN PATENT DOCUMENTS

| EP | 1 065 567 A2 | 1/2001 |
|---|---|---|
| JP | 11-16805 | 1/1999 |
| JP | 11-186132 | 7/1999 |

OTHER PUBLICATIONS

J.H. Chen et al.: "A practical automatic feedback system for poly photo CD control", SPIE, vol. 2876, pp. 225–231.

*Primary Examiner*—Christopher G. Young
(74) *Attorney, Agent, or Firm*—Laurence A. Greenberg; Werner H. Stemer; Ralph E. Locher

(57) ABSTRACT

In the control method for photolithographic processes, line width errors and/or positional errors measured on processed semiconductor wafers are used to calculate correction values for the exposure intensity and/or the xy positioning of the semiconductor wafer. Optimized correction values for a subsequent batch of semiconductor wafers to be processed are calculated by averaging correction values over a number of previously calculated correction values. Only those correction values which lie within a predetermined value range are used in the average.

9 Claims, 2 Drawing Sheets

CONTROL SYSTEM AND METHODS FOR PHOTOLITHOGRAPHIC PROCESSES

BACKGROUND OF THE INVENTION

FIELD OF THE INVENTION

The invention lies in the semiconductor technology and photolithography processing field. More specifically, the invention relates to a control system for photolithographic processes on semiconductor wafers coated with photoresist, and to a method of controlling photolithographic processes of this type by using a control system of this type. A control system according to this type includes a control loop with which, in an automatic process, specific process parameters are modified by measuring and evaluating the resist structures from already processed semiconductor wafers and used for the process management of the semiconductor wafers subsequently to be processed.

In the production of integrated microelectronic semiconductor circuits, as a rule, in at least one process step, a layer of a photoresist is applied to the surface of a semiconductor wafer and structured by means of photolithographic processes. The structuring is carried out by optical projection of a mask structure onto the resist layer and subsequent development of the resist layer. For the optical imaging, use is made of a wafer stepper or photostepper, as it is known, which uses a UV light source, a mask reticule, an optical imaging device and a support table for a semiconductor wafer. In the optical imaging method, at most a 5:1 reduction in the size of the mask onto the resist layer is performed. In X-ray lithography, on the other hand, an optical shadow of the mask located at a short distance above the resist layer is produced on the resist layer in the proximity method, as it is known.

As early as during the 1980s, the requirements on the accuracy of the exposure processes represented a problem, which could no longer be managed with tolerances on the systems. In order to optimize the exposure process, the photosteppers used as the exposure machines offer the possibility of changing the exposure intensity or dose, the focusing and the positioning of the semiconductor wafer on the support table continuously, manually or under computer control. In the case of a computer-controlled change, correction values (offset values) for the exposure intensity, the focusing or the xy positioning of the semiconductor wafer on the support table can be input on an input unit by an operator. When a new exposure process is started, this is carried out by the wafer stepper with the new correction values.

These setting possibilities then open up two variants with which, in spite of relatively high requirements, it is still possible to operate with the existing machines.

In the first variant, referred to as the precursor principle, first of all a wafer is removed from a batch (group of or predefined number of semiconductor wafers to be processed), provided with a photoresist layer, exposed in a photostepper, using a mask with defined structures with standard parameters, and then developed. The structured photoresist layer is then measured for positional errors (OV, overlay) and line width errors (CD, critical dimension) of the photoresist structures produced, by means of a scanning electron microscope or an optical microscope, and the measured deviations are documented. By using these measured results, the optimum setting values for the exposure intensity, the focusing and the xy-positioning of the semiconductor wafers of the entire batch are determined. The photoresist on the precursor wafer is removed and the entire batch is then exposed with the correction values (offset values) determined. This first variant offers the highest possible accuracy, but also has a critical disadvantage. The processing of an entire batch lasts about 45 to 60 minutes, since separate units for the individual process steps are available in the systems and therefore a number of semiconductor wafers can be processed simultaneously. However, the single operations of processing and measuring an individual semiconductor wafer last about 15 to 25 minutes plus measurement time, so that overall the throughput of the machines decreases by more than 30%.

For mass production, therefore, a second variant, namely the statistical monitoring of the measured values for determining optimum setting or correction values, has gained acceptance. At the start, the measured results are assessed once each day by an engineer and used to define the correction values in the form of exposure intensity and xy-positioning tables for the next 24 hours, the focusing mostly being kept to a constant value. For this type of evaluation, the "Western Electric Rules" had proved to be a reliable instrument. However, this evaluation must be carried out separately for each photostepper, each product and each exposure level. With the increasing number of exposure levels in various products, this optimization assumes dimensions which can only be managed by automating the evaluation.

The publication "A practical automatic feedback system for poly photo CD control" by J. H. Chen and C. Y. Wang in SPIE, Volume 2876, pages 225–31, describes a process control system for photolithographic processes in which, immediately before the start of the processing of a batch, from the measured line width errors and the exposure intensities used in the preceding five (or three) batches, and the desired line widths, a corrected exposure intensity for the batch to be processed is calculated by means of a known linear relationship between the line width (of a web or of a trench) and the exposure intensity used, and is set on the photostepper. Known control systems of this type may become unstable under certain condition if an incoming oscillation does not vanish after a short time but, instead, builds up.

This can occur, for example, if a batch is measured with a systematic measurement error, the measured results from this batch therefore wrongly differ significantly in a specific direction from those of another batch, and/or if a poor or incorrect mathematical computational model is used. If, for example, the average line width measured for a batch is significantly falsified, its use in the control system can lead to an incorrect value for the corrected exposure intensity, so that the error builds up and the oscillatory deviation is amplified.

From a statistical point of view, disturbances of this type could be averaged out by the calculation of the correction values being carried out from the measured data from a relatively large number of batches processed earlier. As a result, however, the reaction time of the control system increases in an unacceptable way, so that the real-time character of the control system is lost.

SUMMARY OF THE INVENTION

The object of the present invention is to provide a control system for photolithographic processes which overcomes the above-noted deficiencies and disadvantages of the prior art devices and methods of this general kind, and which provides for the development of a generic control system for photolithographic processes in such a way that instabilities of the type described can largely be avoided.

With the above and other objects in view there is provided, in accordance with the invention, a method of controlling photolithographic processes, which comprises the following method steps:

a) photolithographically processing a batch of a predefined number of semiconductor wafers with predefined values for one of an exposure intensity and an xy-positioning;

b) measuring one of positional errors and line width errors on the processed semiconductor wafers;

c) calculating batch-related correction values for one of the exposure intensity and the xy position with reference to the processed batch based on parameters selected from the group consisting of the measured positional errors, line width errors, predefined desired values for the position, the line width, and predetermined algorithms for the calculation, and storing the batch-related correction values;

d) calculating optimized correction values for processing a next batch based on the correction values from previously processed batches lying within a predetermined value range; and e) repeating method steps a) to d) with a next batch, and thereby using the optimized correction values as the predefined values.

The positional errors and/or the line width errors may be measured automatically or manually.

In accordance with a concomitant feature of the invention, value ranges are defined for the measured values to be used in the calculation by using a number of measured values from previously processed batches to form standard deviations and averages; and forming a center of the value ranges by the averages and the magnitude of the value ranges from the standard deviations multiplied by a constant.

In other words, the control method according to the invention for photolithographic processes on semiconductor wafers coated with photoresist has the following method steps:

In a first method step a), first of all photolithographic processing is carried out on a predefined number (batch, of semiconductor wafers with predefined values for the exposure intensity and/or the xy positioning.

In a second method step b), automatic or manual measurement of positional errors and/or line width errors is carried out on the processed semiconductor wafers in the batch.

In a third method step c), a calculation is made of the correction values for the exposure intensity and/or the xy positioning with reference to the batch processed, on the basis of the measured positional errors and/or line width errors, predefined desired values for the position and/or the line width and predetermined algorithms for the calculation, and the batch-based correction values are stored.

In a fourth method step d), optimized correction values for the exposure intensity and/or the xy positioning are carried out for processing a possible next batch at the same level and technology on the basis of such correction values from pre-processed batches which lie within a predetermined value range.

In a fifth, summary method step e), method steps a) to d) are run through again with the next batch, the optimized correction values being used as the predefined values.

The predefined values used in method step a) at the start of the method can be obtained by an individual precursor wafer being processed photolithographically on the basis of pre-set values for the exposure intensity and/or the xy positioning, and the values of the positional errors and/or line width errors measured on the precursor disc, the predefined desired values for the position and/or the line width, and predetermined algorithms for the calculation being used to determine the predefined values.

The value ranges used in method step d) can be defined by standard deviations and averages being formed from a number of correction values of batches processed previously, and the centre of the value ranges being formed by the averages and the magnitude of the value ranges being formed by the standard deviations multiplied by a constant.

The value ranges are therefore determined to a decisive extent by the past or "history" of the photolithographic process.

The control method according to the invention therefore uses, as control variables, the batch-related correction values calculated from the measurement directly after the processing of a batch. An abrupt change in these control variables will not be detected initially, for example will be ignored when calculating optimum correction values for processing the next batch, since an abruptly changed correction value lies outside the respective predetermined value range. Only when sufficient deviating correction values have collected in the memory will they be taken into account by the control system, since the then increasing number of deviating correction values has shifted the value range appropriately. Random "outliers" among the correction values, which can be produced for example by a systematic measurement error which occurs only for a time, on the other hand have virtually no influence on the control process, so that instabilities cannot occur, nor can oscillations build up in the control process.

When defining the value ranges, typically a search is made for the correction values, stored in the memory, from the last 15 to 40 batches whose entries are not older than a specific time period, for example 50,000 minutes. From the correction values from these batches, that is to say for example the exposure intensity values of these batches, an arithmetic mean is formed, which is used as the centre of the value range. In addition, a standard deviation $\sigma$ is formed from the correction values and, typically, the magnitude of the value range is defined as $2\sigma$ to $3\sigma$.

It is preferable if, as early as in method step c), a check is made when storing the batch-related correction values to see whether the correction values lie within the value ranges envisaged for them or not, that is to say whether the correction value determined on the basis of the batch for the exposure intensity lies within the exposure intensity value range, and whether the correction value determined on the basis of the batch for the xy positioning lies within the xy positioning value range. At the time of storage, then, an appropriate identification is provided in an associated further memory location, for example OK for "within the value range" and OL for "outside the value range". In method step d), it is then relatively simple, on the basis of this identification, for the correction values from previously processed batches which are admissible for calculating the optimized correction values to be filtered out.

In method step d), the optimized correction values can be formed from the average of the last previous admissible correction values, that is to say, for example, those identified with OK. Typically, the last 5 to 10 OK-marked database entries are used for this purpose.

With the above and other objects in view there is also provided, in accordance with the invention, a control system for photolithographic processes on semiconductor wafers coated with photoresist, comprising:

a photostepper (containing a light source with variable exposure intensity, a mask reticle, and a support table for a semiconductor wafer with variable xy positioning);

a measurement station for (automatically or manually) measuring errors such as positional errors and/or line width errors of photoresist structures produced by the photolithographic process;

a computer/memory unit connected to the measurement station and to the photostepper, and configured to:

calculate correction values for one of an exposure intensity and an xy position with reference to a batch being processed on a basis of errors selected from the group consisting of measured positional errors, line width errors, predefined desired value for a position ($Ov_{des}$ and/or the line width and predefined algorithms for the calculation;

store the correction values as batch-related correction values; and calculate optimized correction values for processing a next batch based on batch-related correction values from previously processed batches lying within a predetermined value range.

In accordance with an added feature of the invention, a controllable stepper interface forms a connecting link between the photostepper and the computer/memory unit.

In accordance with an additional feature of the invention, the stepper interface has an input unit and a display unit; and the input unit is configured to receive characteristic input data relating to a batch of semiconductor wafers to be processed.

In other words, the control system according to the invention for photolithographic processes on semiconductor wafers coated with photoresist, for carrying out the control process according to the invention, has the following units or subassemblies:

a photostepper—containing a light source with variable exposure intensity, a mask reticle, and a support table for a semiconductor wafer with variable xy positioning;

a measurement station for the automatic or manual measurement of positional errors and/or line width errors of the photoresist structures produced by the lithography;

a computer/memory unit, connected to the measurement station and the photostepper, for calculating the correction values for the exposure intensity and/or the xy positioning with reference to the processed batch on the basis of the measured positional errors and/or line width errors, predefined desired values for the position and/or the line width and predefined algorithms for the calculation, for storing the batch-related correction values and for calculating optimum correction values for processing a possible next batch on the basis of such correction values from pre-processed batches which lie within a predetermined value range.

The control system according to the invention preferably has a controllable stepper interface as a connecting link between the photostepper and the computer/memory unit. This stepper interface can have an input unit and a display unit and, at the input unit, characteristic data relating to the batch to be processed or to process sequences can be input by the user, and process or machine parameters or the like can be displayed on the display unit.

Other features which are considered as characteristic for the invention are set forth in the appended claims.

Although the invention is illustrated and described herein as embodied in a control system for photolithographic processes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the following description of the prior art and of the invention, it will be assumed that, on the photostepper used for the photolithographic processing, substantially only the variables "exposure intensity E" and the "xy-positioning" can be varied, but that the focusing, that is to say the position of the mask reticle on the optical axis, remains constant.

However, the focusing can also be controlled by evaluating suitable structures.

Figure 1:
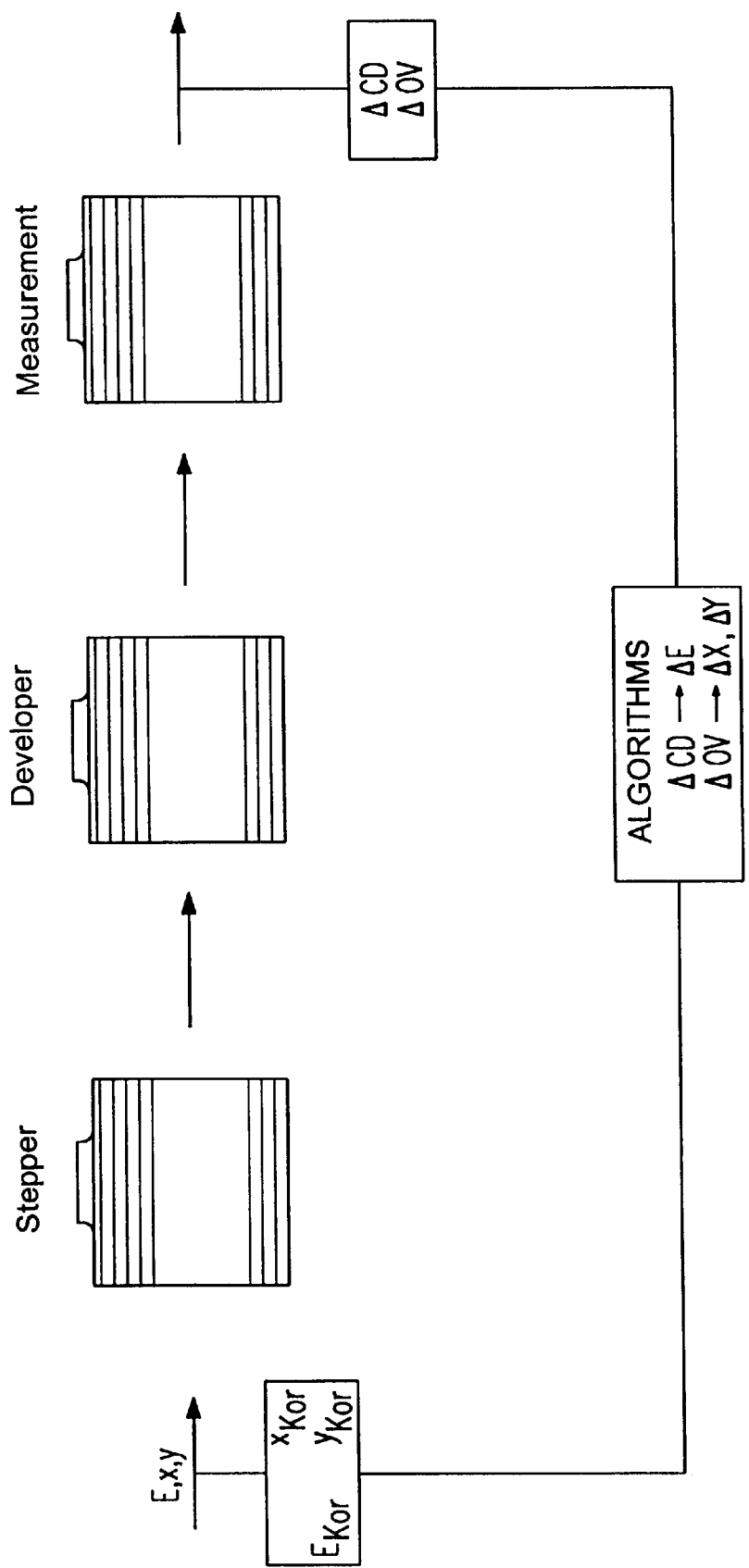
FIG. 1 is a schematic illustration of a conventional prior art control method for photolithographic processes.

Referring now to the figures of the drawing in detail and first, particularly, to FIG. 1 thereof, there is seen a schematic of three work stations of a control system for photolithographic processing, namely a photostepper, a charging and developing station, and a measurement station. In each work station, one batch of semiconductor wafers is found and is processed in accordance with the predefined process parameters. The control system illustrated is essentially a closed-loop control system.

At the start of each process sequence, first of all predefined values E and x, y must be supplied to the photostepper, since the latter cannot yet extract these from the control loop because of the lack of previous history. In each case therefore, it is necessary for values from experience to be input into the photostepper first. Instead of processing an entire batch immediately with these values from experience, a precursor wafer, as it is known, can be processed first by using the values from experience, however. The precursor wafer is lacquered and then processed with these predefined values in the photostepper, developed in the developing station, and then measured for positional errors $\Delta OV$ and line width errors $\Delta CD$. From these, correction values $E_{KOR}$ and $X_{KOR}$, $Y_{KOR}$ are calculated by means of predefined algorithms. Using these correction values, a first batch of semiconductor wafers is then processed. In the photostepper, a specific mask structure is imaged on the photoresist layer on the semiconductor wafer during the exposure. After either the exposed or the unexposed areas of the photoresist layer have been removed in the developing station, depending on whether a positive or a negative resist was used, in the measurement station, the resist structures obtained are measured for positional errors and line width errors, using a scanning electron microscope or an optical microscope. For this purpose, test structures are used which consist of webs, trenches or holes, whose flanges are always set slightly at an angle. In the case of line width measurements, in the case of a web as a test structure, its width is assumed to be the measured line width, while in the case of a trench as a test structure, its lower width is assumed to be measured line width. The positional errors and line width errors, the desired values for the xy position and the line width, and also the predefined algorithms for the calculation are used to calculate correction values for the exposure dose E and the xy positioning. In order to obtain statistical averaging, the averages from the measured results from a given number or batches processed previously are determined and used as a basis for calculating the correction values. A small number of batches, whose measured results are averaged, means a quick reaction time of the control loop, but an increased susceptibility to instabilities on the basis of random "outliers", and a large number of batches, whose measured results are averaged, reduces the susceptibility to instabilities, since averaging is carried out over "outliers", but makes the reaction time of the control loop relatively slow.

Figure 2:
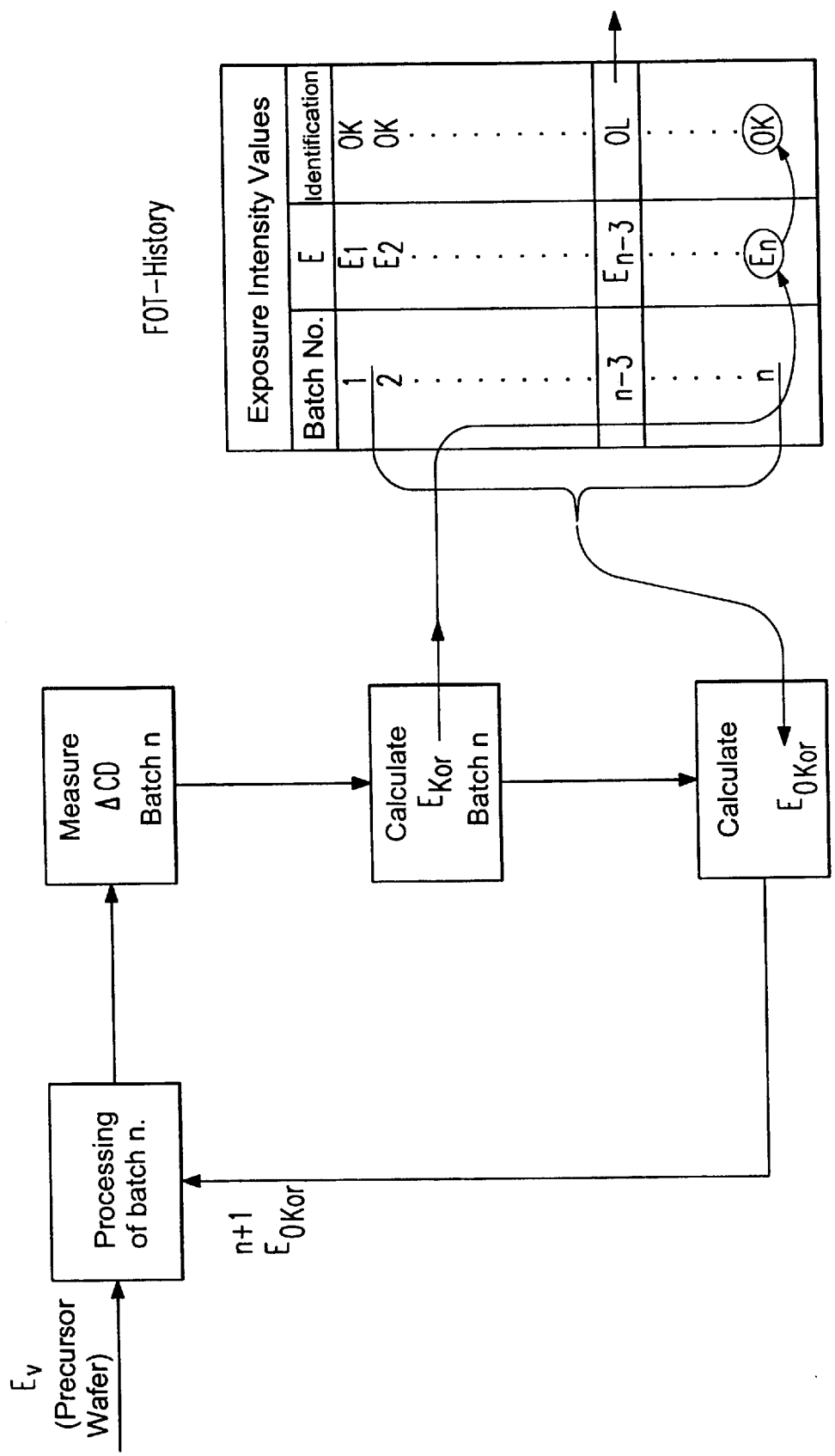
FIG. 2 is an illustration of a flow chart of a control method according to the invention for photolithographic processes.

Referring now to FIG. 2, there is illustrated a control method according to the invention in schematic form in the form of a simplified flow chart. For reasons of simplicity only the control of the exposure intensity via the measured line widths are illustrated. However, the control can likewise be carried out in parallel for controlling the xy positioning from the measured overlay data.

The process control sequence will be described for an n batch. When n=1, then the value for the exposure intensity must either be predefined as a value from experience or—as already described—is obtained as an exposure intensity value Ev from the processing and evaluation of a precursor wafer. If it is assumed that the remaining parameters of the photostepper are either permanently set or are controlled automatically, the batch n can then be processed. After processing has been finished, there is a number of semiconductor wafers with test structures whose line widths are then measured with the scanning electron microscope. The measured line widths are used to calculate an average line width $CD_{mes}$, which results in an average line width error $\Delta CD = CD_{mes} - CD_{des}$ for the n batch.

Then, by means of the two following formulas, a correction value $E_{KOR}$ is determined as follows:

$$E_{KOR} = E_V - (CD_{mes} - CD_{des}) \cdot k \text{ for webs}$$

and $$E_{KOR} = E_V + (CD_{mes} - CD_{des}) \cdot k \text{ for trenches and holes}$$

Here, $E_{KOR}$ is the correction value for the exposure intensity, $E_V$ is the predefined value of the exposure intensity, $CD_{mes}$ is the average of the measured line widths, $CD_{des}$ is the desired value of the line width and k is the gradient of the functional relationship between the line width and the exposure intensity.

At this point, it should be mentioned that, to determine the xy positioning correction values, a significantly more complex evaluation is needed in the case of corresponding control of the positional errors. During the measurement, only the displacement of a test structure in the x and y directions can be determined. However, the photostepper provides an 8-parameter or 10-parameter model for the optimization of the positional accuracy.

In the next step, the calculated value $E_{KOR}$ is then fed to a tabular memory ("FOT History"). In the tabular memory, the determined exposure intensity values $E_n$ for all the batches already processed, together with the respective batch number and an identifier OK/OL are stored. In addition, the time of the respective measurement can also be stored as well. The identification OK or OL is allocated on the basis of a check as to whether the correction value $E_n$ just determined lies within a previously determined value range. Its value range is defined by the correction values from the earlier batches, for example the preceding 15 to 40 batches. In this case, there may be an upper time limit up to which the batches previously processed are also to be included, together with their correction values (for example 50,000 minutes). These correction values previously determined are used to form an average, which forms the center of the value range to be defined. At the same time, a standard deviation σ is calculated, and the magnitude of the value range to be defined is determined by multiplying σ by a constant, which may for example lie between 2 and 3. It is then possible to determine immediately whether the correction value $E_n$ determined shortly beforehand lies within the value range or not. In the first case, the identification noted is OK and, in the second case, the identification noted is OL.

In the next step, an optimized correction value $E_{OKOR}$ is calculated by a number of the correction values $E_n$ determined last, for example the last 10 to 15 correction values $E_n$, with an OK identifier being used to form the arithmetic mean. In the present example, during the checking in the previous method step, the result was that the correction value $E_{n-3}$ determined for the batch number n–3 did not lie within the value range and was therefore given the identification OL. The consequence of this is that in the current method step, this correction value is not included in the averaging and therefore remains unconsidered. In the systematic structure of the control method according to the invention, this correction value is judged to be an "outlier" and not considered for the control process.

It is also possible to weight correction values previously determined from specific batches in a different way, for example to assign the batch last measured with twice the weighting than the other measured batches.

The behavior would be different if the deviation of the correction value $E_{n-3}$ had not been a random "outlier", but if it had had as its cause the start of a drift of process parameters of the photostepper or the like. Then, the following correction values would also have been provided with the identification OL and would therefore initially have remained unconsidered. However, since the correction values identified by OL are themselves also used to determine the scatter, after a certain accumulation of correction values identified with OL, the value range is shifted in the direction of these correction values, so that these correction values come to lie within the shifted value range after a certain time. The control then also leads to a correction of the optimized correction values $E_{OKOR}$.

We claim:

1. A method of controlling photolithographic processes, which comprises the following method steps:
   a) photolithographically processing a batch of a predefined number of semiconductor wafers with predefined values for one of an exposure intensity and an xy-positioning;
   b) measuring one of positional errors and line width errors on the processed semiconductor wafers;
   c) calculating batch-related correction values for one of the exposure intensity and the xy position with reference to the processed batch based on parameters selected from the group consisting of the measured positional errors, line width errors, predefined desired values for the position, the line width, and predetermined algorithms for the calculation, and storing the batch-related correction values;

d) calculating optimized correction values for processing a next batch based on the correction values from previously processed batches lying within a predetermined value range; and e) repeating method steps a) to d) with a next batch, and thereby using the optimized correction values as the predefined values.

2. The method according to claim 1, wherein step b) comprises automatically measuring the positional errors and/or the line width errors.

3. The method according to claim 1, wherein step b) comprises manually measuring the positional errors and/or the line width errors.

4. The method according to claim 1, wherein step c) comprises defining value ranges for the measured values to be used in the calculation by using a number of measured values from previously processed batches to form standard deviations and averages; and forming a center of the value ranges by the averages and the magnitude of the value ranges from the standard deviations multiplied by a constant.

5. A control system for photolithographic processes on semiconductor wafers coated with photoresist, comprising:

a photostepper;

a measurement station for measuring errors selected from the group consisting of positional errors and line width errors of photoresist structures produced by a photolithographic process;

a computer/memory unit connected to said measurement station and to said photostepper, and configured to:

calculate correction values for one of an exposure intensity and an xy position with reference to a batch being processed on a basis of errors selected from the group consisting of measured positional errors, line width errors, predefined desired value for a position, the line width, and predefined algorithms for the calculation;

store the correction values as batch-related correction values; and calculate optimized correction values for processing a next batch based on batch-related correction values from previously processed batches lying within a predetermined value range.

6. The control system according to claim 1, wherein said measurement station is an automatic measurement station.

7. The control system according to claim 1, wherein said measurement station is a manually operated measurement station.

8. The control system according to claim 1, which further comprises a controllable stepper interface forming a connecting link between said photostepper and said computer/memory unit.

9. The control system according to claim 4, wherein:

said stepper interface has an input unit and a display unit; and said input unit is configured to receive characteristic input data relating to a batch of semiconductor wafers to be processed.

* * * * *